United States Patent
Draxler et al.

(10) Patent No.: US 9,631,270 B2
(45) Date of Patent: Apr. 25, 2017

(54) CARBON-BASED COATING

(71) Applicant: High Tech Coatings GmbH, Laakirchen (AT)

(72) Inventors: Markus Draxler, Asten (AT); Susan Field, West Midlands (GB); Klaus Preinfalk, Niederneukirchen (AT)

(73) Assignee: High Tech Coatings GmbH, Laakirchen (AT)

( * ) Notice: Subject to any disclaimer, the term of this patent is extended or adjusted under 35 U.S.C. 154(b) by 324 days.

(21) Appl. No.: 14/364,602

(22) PCT Filed: Dec. 11, 2012

(86) PCT No.: PCT/AT2012/050191
§ 371 (c)(1),
(2) Date: Jun. 11, 2014

(87) PCT Pub. No.: WO2013/086552
PCT Pub. Date: Jun. 20, 2013

(65) Prior Publication Data
US 2014/0329070 A1    Nov. 6, 2014

(30) Foreign Application Priority Data
Dec. 12, 2011  (AT) .................... A 1810/2011

(51) Int. Cl.
*C23C 14/06* (2006.01)
*C23C 14/14* (2006.01)
(Continued)

(52) U.S. Cl.
CPC .......... *C23C 14/14* (2013.01); *C23C 14/0605* (2013.01); *C23C 14/185* (2013.01);
(Continued)

(58) Field of Classification Search
CPC .......................................... C23C 28/40–28/44
See application file for complete search history.

(56) References Cited

U.S. PATENT DOCUMENTS

| 4,525,417 A * | 6/1985 | Dimigen | ................. C23C 30/00 |
| | | | 204/192.15 |
| 4,619,865 A * | 10/1986 | Keem | .................... C23C 28/00 |
| | | | 204/192.15 |

(Continued)

FOREIGN PATENT DOCUMENTS

| CA | 2261062 C | 11/2001 |
| CN | 101319324 A | 12/2008 |

(Continued)

OTHER PUBLICATIONS

Machine translation of CN 103739311 A, obtained using Google Patent service on Jun. 30, 2016.*

(Continued)

*Primary Examiner* — Aaron Austin
*Assistant Examiner* — Zheren J Yang
(74) *Attorney, Agent, or Firm* — Collard & Roe, P.C.

(57) ABSTRACT

The invention relates to a carbon-based coating (2) which as well as carbon as principal ingredient has at least one first element selected from a group consisting of the transition metals from groups 3 to 10 of the Periodic Table of the Elements, the carbon in the coaling (2) being present predominantly in $sp^2$-hybridized form, and the coating (2) comprising at least one further element from a group encompassing silicon, germanium, aluminum, and the transition metals from groups 3 to 10 of the Periodic Table of the Elements, with the proviso that said at least one further element is not the same as the first element, and the cumulative fraction of said at least one further element in the coating (2) is between 0.1 at % and 5 at %, and the (Continued)

cumulative fraction of said at least one first element is between 0.5 at % and 10 at %.

14 Claims, 9 Drawing Sheets

(51) Int. Cl.
    *C23C 14/18*     (2006.01)
    *C23C 14/35*     (2006.01)
    *C23C 14/50*     (2006.01)
    *C23C 28/00*     (2006.01)

(52) U.S. Cl.
    CPC ............ *C23C 14/35* (2013.01); *C23C 14/505* (2013.01); *C23C 28/00* (2013.01); *C23C 28/322* (2013.01); *C23C 28/34* (2013.01); *C23C 28/343* (2013.01); *C23C 28/36* (2013.01); *C23C 28/42* (2013.01); *Y10T 428/2495* (2015.01); *Y10T 428/30* (2015.01)

(56) References Cited

U.S. PATENT DOCUMENTS

| | | | | |
|---|---|---|---|---|
| 6,066,399 | A * | 5/2000 | Hirano | C23C 16/029 427/249.1 |
| 6,080,470 | A * | 6/2000 | Dorfman | B32B 9/00 427/212 |
| 6,110,329 | A * | 8/2000 | Holleck | C23C 14/027 204/192.15 |
| 6,139,022 | A * | 10/2000 | Iwashita | C23C 16/26 277/442 |
| 6,142,481 | A * | 11/2000 | Iwashita | C23C 16/26 277/442 |
| 6,245,446 | B1 * | 6/2001 | Schier | B32B 18/00 428/472 |
| 6,617,058 | B2 * | 9/2003 | Schier | C23C 14/024 428/216 |
| 7,060,345 | B2 * | 6/2006 | Fukui | C23C 14/0635 428/216 |
| 7,879,443 | B2 * | 2/2011 | Endrino | C23C 30/00 428/336 |
| 8,178,213 | B2 * | 5/2012 | Werger | C23C 26/00 428/408 |
| 9,140,389 | B2 * | 9/2015 | Moreira De Carvalho | B82Y 30/00 |
| 2001/0028926 | A1 * | 10/2001 | Strondl | C23C 14/025 427/561 |
| 2001/0031346 | A1 * | 10/2001 | Iwamura | C23C 28/046 428/212 |
| 2002/0102398 | A1 * | 8/2002 | Shi | C23C 14/06 428/334 |
| 2002/0136895 | A1 * | 9/2002 | Kohara | C23C 14/025 428/408 |
| 2003/0129407 | A1 * | 7/2003 | Teer | C23C 14/0605 428/408 |
| 2004/0038033 | A1 * | 2/2004 | Massler | C23C 16/029 428/408 |
| 2005/0242156 | A1 * | 11/2005 | Jabs | C23C 16/0272 228/101 |
| 2006/0026946 | A1 * | 2/2006 | Schuller | D01H 4/32 57/404 |
| 2006/0105172 | A1 * | 5/2006 | Yamamoto | C23C 14/025 428/408 |
| 2006/0182895 | A1 * | 8/2006 | Denul | C23C 16/0272 427/588 |
| 2006/0246290 | A1 * | 11/2006 | Oda | C23C 14/024 428/408 |
| 2006/0280946 | A1 * | 12/2006 | Cooper | C23C 28/322 428/408 |
| 2007/0054125 | A1 * | 3/2007 | Akari | C23C 14/024 428/408 |
| 2007/0082129 | A1 * | 4/2007 | Shimoda | C23C 14/0021 427/249.7 |
| 2007/0098993 | A1 * | 5/2007 | Chen | C23C 28/044 428/408 |
| 2007/0116956 | A1 * | 5/2007 | Chen | C23C 16/029 428/408 |
| 2007/0254187 | A1 * | 11/2007 | Yamamoto | C23C 14/022 428/698 |
| 2007/0278444 | A1 * | 12/2007 | Brondum | C23C 14/025 251/368 |
| 2007/0284255 | A1 * | 12/2007 | Gorokhovsky | C22C 38/44 205/89 |
| 2008/0076683 | A1 * | 3/2008 | Okamoto | C23C 14/027 508/103 |
| 2008/0166287 | A1 * | 7/2008 | Venkatraman | C23C 16/0272 423/446 |
| 2008/0193649 | A1 * | 8/2008 | Jacquet | C23C 28/044 427/294 |
| 2008/0203674 | A1 * | 8/2008 | Jacquet | C23C 16/0272 277/444 |
| 2008/0233425 | A1 * | 9/2008 | Dekempeneer | C23C 28/044 428/634 |
| 2009/0022969 | A1 * | 1/2009 | Zhang | C23C 14/0647 428/216 |
| 2009/0098361 | A1 * | 4/2009 | Sato | C23C 14/025 428/323 |
| 2009/0155561 | A1 * | 6/2009 | Choi | B82Y 30/00 428/220 |
| 2009/0169845 | A1 * | 7/2009 | Leu | C22C 1/002 428/216 |
| 2009/0190312 | A1 * | 7/2009 | Katayama | H01L 21/268 361/708 |
| 2009/0202790 | A1 * | 8/2009 | Eerden | C23C 28/00 428/195.1 |
| 2009/0209942 | A1 * | 8/2009 | Nakatani | A61F 2/0077 604/528 |
| 2010/0044968 | A1 * | 2/2010 | Fischer | C23C 14/0641 277/443 |
| 2010/0055464 | A1 * | 3/2010 | Sung | B01J 21/18 428/408 |
| 2010/0086250 | A1 * | 4/2010 | Evans | F16C 33/36 384/571 |
| 2010/0210489 | A1 * | 8/2010 | Honda | C10M 103/02 508/108 |
| 2010/0211180 | A1 * | 8/2010 | Helmuth | C23C 28/048 623/23.5 |
| 2010/0247883 | A1 * | 9/2010 | Gong | C23C 14/025 428/213 |
| 2010/0247885 | A1 * | 9/2010 | Ito | C23C 14/024 428/216 |
| 2010/0285396 | A1 * | 11/2010 | Vyas | C23C 14/0605 429/518 |
| 2011/0052934 | A1 * | 3/2011 | Sugimoto | C23C 14/0605 428/623 |
| 2011/0101620 | A1 * | 5/2011 | Hoppe | C23C 16/0272 277/442 |
| 2011/0135898 | A1 * | 6/2011 | Bohlmark | C23C 14/00 428/216 |
| 2011/0165435 | A1 * | 7/2011 | Rost | C23C 14/0635 428/634 |
| 2011/0195265 | A1 * | 8/2011 | Oohira | C23C 28/322 428/552 |
| 2011/0203791 | A1 * | 8/2011 | Jin | E21B 17/042 166/244.1 |
| 2011/0220415 | A1 * | 9/2011 | Jin | C23C 14/024 175/57 |
| 2011/0256371 | A1 * | 10/2011 | Layyous | C23C 14/35 428/216 |
| 2011/0305912 | A1 * | 12/2011 | Teer | C23C 14/35 428/457 |
| 2012/0205875 | A1 * | 8/2012 | Kennedy | C23C 16/0281 277/442 |
| 2012/0318228 | A1 * | 12/2012 | Aharonov | C23C 16/509 123/193.2 |
| 2013/0004756 | A1 * | 1/2013 | Kennedy | C23C 14/0605 428/216 |

(56) References Cited

U.S. PATENT DOCUMENTS

| | | | | |
|---|---|---|---|---|
| 2014/0038868 A1* | 2/2014 | Mori | .......................... | F02F 3/10 508/300 |
| 2014/0128298 A1* | 5/2014 | Becker | .................. | C23C 14/021 508/107 |
| 2014/0219595 A1* | 8/2014 | Tsutsui | .................. | C23C 14/024 384/462 |
| 2014/0323368 A1* | 10/2014 | Avelar Araujo | ...... | C23C 14/024 508/105 |
| 2015/0018254 A1* | 1/2015 | Araujo | ....................... | F16J 9/26 508/105 |

FOREIGN PATENT DOCUMENTS

| | | | |
|---|---|---|---|
| CN | 101444985 A | | 6/2009 |
| CN | 103739311 A | * | 4/2014 |
| EP | 0795622 A1 | | 9/1997 |
| EP | 1 036 208 B1 | | 1/2005 |
| JP | H10-237627 A | | 9/1998 |
| JP | 2002161352 A | * | 6/2002 |
| JP | 2003171758 A | * | 6/2003 |
| JP | 2007327037 A | * | 12/2007 |
| JP | 2009161813 A | * | 7/2009 |
| JP | 2009203556 A | * | 9/2009 |
| WO | 97/48836 A1 | | 12/1997 |
| WO | 99/27893 A2 | | 6/1999 |
| WO | 2008/078675 A1 | | 7/2008 |

OTHER PUBLICATIONS

Machine translation of JP 2003/171758 A, obtained from Industrial Property Digital Library of the JPO on Jun. 30, 2016.*
Machine translation of JP 2009/161813 A, obtained from Industrial Property Digital Library of the JPO on Jun. 30, 2016.*
Machine translation of JP 2009/203556 A, obtained from Industrial Property Digital Library of the JPO on Jun. 30, 2016.*
Machine translation of JP 2002/161352 A, obtained from Industrial Property Digital Library of the JPO on Jul. 1, 2016.*
International Search Report of PCT/AT2012/050191, mailed Mar. 26, 2013.
S.-E. Ong et al, "Relationship between bonding structure and mechanical properties of amorphous carbon ,mntaining silicon", Diamond & Related Materials 16 (2007) 1628-1635.

* cited by examiner

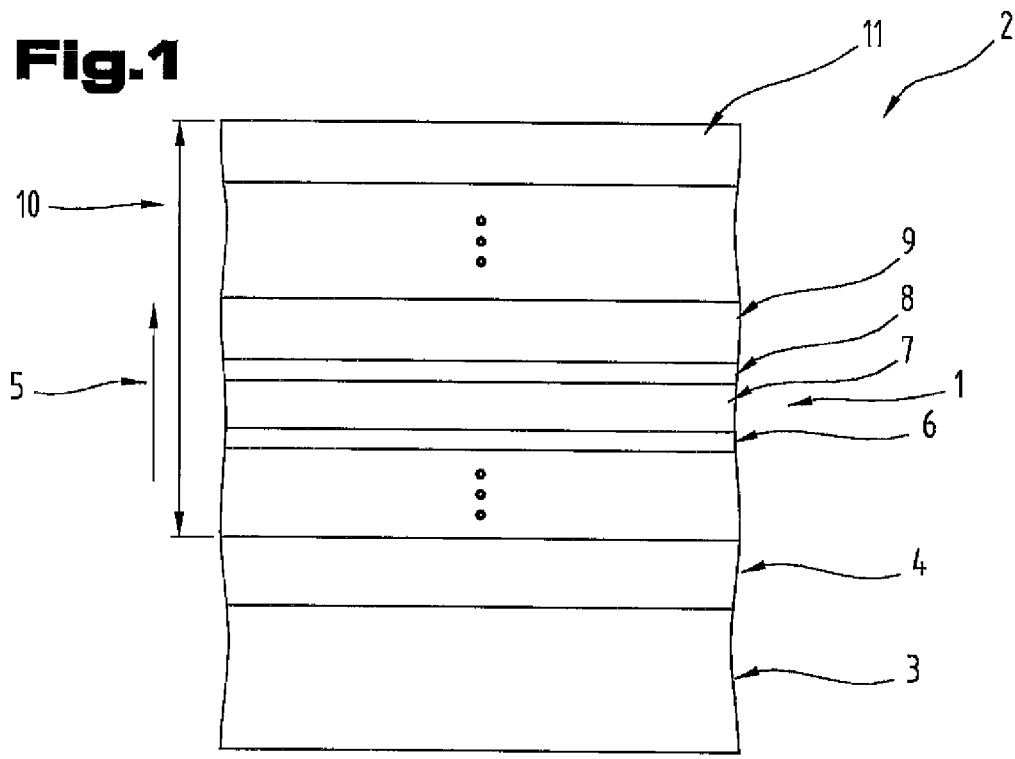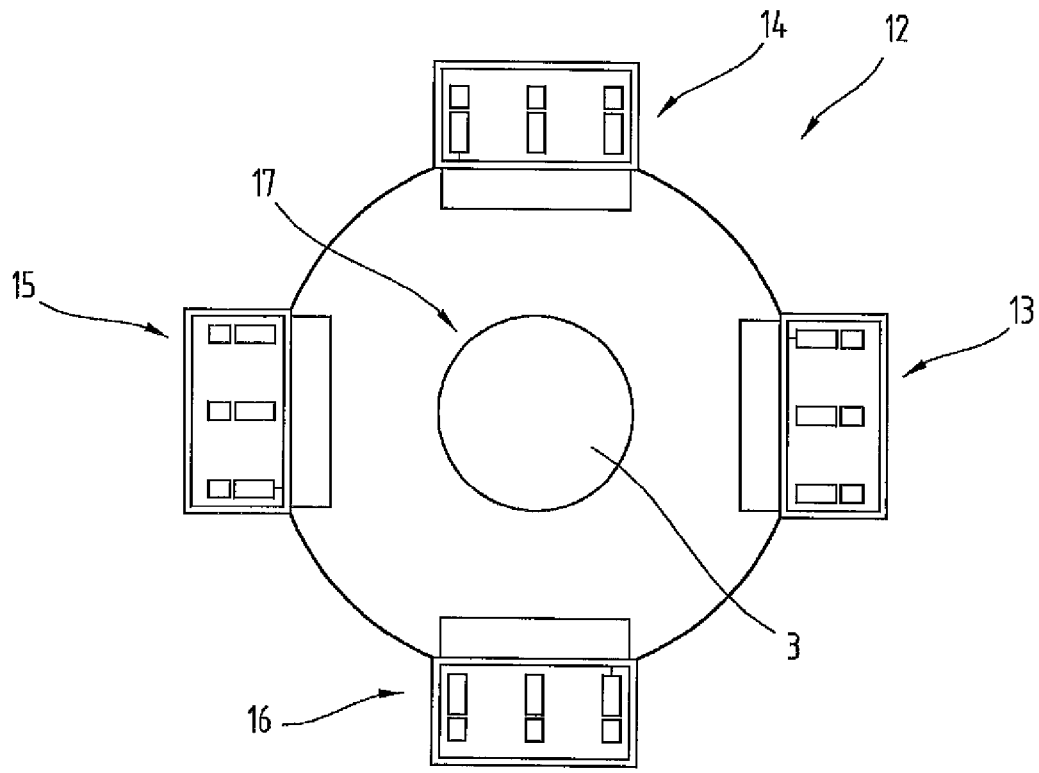

CARBON-BASED COATING

CROSS REFERENCE TO RELATED APPLICATIONS

This application is the National Stage of PCT/AT2012/050191 filed on Dec. 11, 2012, which claims priority under 35 U.S.C. §119 of Austrian Application No. A 1810/20011 filed on Dec. 12, 2011, the disclosure of which is incorporated by reference. The international application under PCT article 21(2) was not published in English.

BACKGROUND OF THE INVENTION

1. Field of the Invention

The invention relates to a carbon-based coating which contains in addition to carbon as the main component at least one first element selected from a group comprising the transition metals from groups 3 to 10 (new IUPAC nomenclature) of the periodic table of the elements, in particular from a group comprising or consisting of titanium, zirconium, hafnium, vanadium, niobium, tantalum, chromium, molybdenum, tungsten, wherein the carbon in the coating is mostly present in $sp^2$-hybridized form, an object with a surface which has a coating, as well as a method for producing a carbon-based coating comprising in addition to carbon as the main component at least one first element selected from a group comprising groups 3 to 10 (new IUPAC nomenclature) of the periodic table of the elements, in particular from a group comprising or consisting of titanium, zirconium, hafnium, vanadium, niobium, tantalum, chromium, molybdenum, tungsten, on a substrate by means of sputtering by using at least one carbon target and at least one target of the first element, wherein the carbon in the coating is mostly in $sp^2$-hybridized form.

2. Description of the Related Art

A method of this kind is already known from EP 1 036 208 B1. In this case a magnetron sputter ion-plating system is used with at least one carbon target, in which the ion current density applied to the substrate to be coated is set to be over 0.5 mA/cm², which is high enough to apply a carbon layer in which the carbon-carbon-bond is mainly present in $sp^2$-grahite form. In addition, at least one metal target made of titanium or chromium is used to apply a metal-containing coating layer, which has a layer thickness of between 50 and 200 nm. The carbon layer has a thickness of at most 1 µm. The substrate is rotated during the coating. In particular, three carbon targets and one metal target are used. In this way a sequence of alternating metal layers and carbon-containing layers is built up. At least two magnetrons are arranged so that a magnetic field is formed in between, wherein field lines run from one magnetron to the other said magnetron, and wherein the magnetrons and field lines which run directly from one said magnetron to the other form a barrier, which tends to prevent the "escape" of electrons from a plasma, which contains the working area in which the substrate is coated.

Said coating has very good mechanical properties, in particular tribological properties, with a specific wear rate in wet conditions of less than $10^{-16}$ m³/Nm, and is therefore used in the automobile industry, e.g. for gear wheels, camshafts, valves, piston rings or cylinder liners. Medical products, such as e.g. prostheses, are mentioned as a further field of application in EP 1 036 208 B1.

Although this coating has proven to be effective in practice it has been observed however that in higher temperature ranges its mechanical strength decreases, in particular its wearing resistance.

SUMMARY OF THE INVENTION

Therefore, the objective of the invention is to improve the possible applications of such a coating.

Said objective is achieved independently by the aforementioned coating, the aforementioned object and the aforementioned method, wherein the coating contains at least one further element from a group comprising or consisting of silicon, germanium, aluminum and the transition metals from groups 3 to 10 (new IUPAC nomenclature) of the periodic table of the elements, in particular titanium, zirconium, hafnium, vanadium, niobium, tantalum, chromium, molybdenum, tungsten, with the proviso that the at least one further element is not the same as the first element, wherein the cumulative fraction of this at least one further element in the coating is between 0.1 at % (atom percent) and 5 at % and the cumulative fraction of the at least one first element is between 0.5 at % and 10 at %, in the object the coating is formed according to the invention and wherein in the method at least one additional target is used, consisting of or comprising at least one further element from a group comprising or consisting of silicon, germanium, aluminum and the transition metals from groups 3 to 10 (new IUPAC nomenclature) of the periodic table of the elements, in particular titanium, zirconium, hafnium, vanadium, niobium, tantalum, chromium, molybdenum, tungsten, with the proviso that the at least one further element is not the same as the first element, wherein the voltage on the substrate is selected such that a cumulative fraction of this at least one further element in the coating is between 0.1 at % and 5 at % and a cumulative fraction of the at least one first element is between 0.5 at % and 10 at %.

Surprisingly it was established that by the addition of the at least one further element the coating can also be used at higher temperatures, wherein wear tests were performed under conditions of use up to a temperature of about 325° C. In contrast to this it was found that the coating known from EP 1 036 208 B1 failed at a temperature of about 250° C. because of graphitization and then the abrasion of carbon. It is assumed that by means of the addition of the at least one additional element the structure of the coating is stabilized so that it can be exposed to higher temperatures. This result is also surprising in that although the addition to so-called a-C DLC layers (a-C=amorphous carbon, DLC=diamond like carbon) is already known from the literature (Soon-Eng Ong, Sam Zhang, Hejun Du, Deen Sun: "Relationship between bonding structure and mechanical properties of amorphous carbon containing silicon", Diamond and Related Materials, 16(2007), 1628-1635, ELSEVIER), it was also established therein that by the addition of silicon the amount of carbon with $sp^2$ hybridization reduces in favor of carbon with $sp^3$ hybridization, and that by the addition of silicon the hardness and the modulus of elasticity reduce to a silicon amount of 16.6 at % and only increase again from this amount. In addition, it is explained in this document that up to this amount of silicon the surface roughness of the a-C film increases and only decreases again afterwards. In the coating according to the invention it was found however that the hardness increases with the increase in the amount of Si—in the observed range of the silicon amount and with the simultaneous reduction of the amount of the at least one transition metal, and that the coefficient of friction decreases under these conditions and increases again after passing through a minimum.

According to one embodiment variant of the coating the coating is formed by a layer system consisting of individual layers of different compositions. Thus the coating is built up in the manner of a layered material on a microscale, whereby it is possible to assign specific tasks to the individual layers and select the composition accordingly, whereby the coating can be improved overall with respect to its properties, as compromises in the properties as found in a single-layered embodiment variant can be avoided. For example it is possible in this way to provide greater layer thicknesses of the coating, as the intermediate layers can function for example as "bonding layers" and can also improve the structural strength of the coating.

Preferably, the layer system is formed by a sequence of individual layers comprising a first layer with the first element as the main component, a second layer with carbon as the main component, a third layer with the further element as a main component and a fourth layer with carbon as the main component. The coating thus has a periodicity of four. With such a structure a further improvement of the coating is achieved with regard to its resilience at higher temperatures, as on the one hand an improvement of the cohesion of the layer system can be achieved by the layers consisting mainly of the first element, and on the other hand the stabilization of the carbon layers can be achieved by the layers of the further element, wherein said further element can act on both sides on the two adjacent carbon layers. It is thus also possible however to replace a portion of the amount of the transitional metal by the further element, as this further element as a metal can also have an adhesive-improving effect within the layer compound structure. Preferably, this configuration is achieved with embodiment variants of the method, in which for the deposition of the coating a sequence of targets is used, whereby the target consisting of or comprising the at least one further element is arranged between two carbon targets or in which for the deposition of the coating a sequence of targets is used, whereby the target consisting of or comprising the at least one first element is arranged between two carbon targets.

According to another embodiment variant of the coating the thicknesses of the individual layers with carbon as the main component are greater than the thicknesses of the individual layers with the first element and the individual layers with the further element. It is possible in this way to avoid more effectively the premature wear of the tribologically active coating, whereby if this should in fact occur the relatively thin metal intermediate layers do not have a negative effect on the performance of the coating, as in particular a carbon layer is already provided underneath said metal layer.

To improve the adhesion of the coating onto a metal substrate or generally onto a substrate it is possible that a first gradation layer of the coating is formed by a graduated transitional layer, in which the proportion of carbon increases in the direction of the overlying individual layer and the proportion of the first element decreases in this direction or the proportion of carbon decreases in the direction of the substrate and the proportion of the first element increases in this direction. In this way any "flaking off" of the coating is avoided more effectively, as in the boundary phase to the (metal) substrate compared to more remote areas of the gradation layer the proportion of metal is very high, whereby the adhesion of the coating on the (metal) substrate can be improved.

In addition, it is also possible that the proportion of the at least one further element increases in the first gradation layer in the direction of the overlying individual layer, whereby the stabilizing effect is improved with respect to the also increasing amount of carbon.

In the particularly preferred embodiment variants of the gradation layer, as explained in more detail below, the proportion of carbon increases from 0 at % to a value of between 90 at % and 100 at % and/or the proportion of the at least one first element decreases from 100 at % to a value of between 0 at % and 6 at % and/or the proportion of the at least one further element increases from 0 at % to a value of between 0.5 at % and 10 at %.

With regard to the layer structure of the coating consisting of individual layers and in particular their tribological behavior with respect to the coefficient of friction it has proved to be advantageous, if the substrate is rotated during the coating at a speed of rotation of between 2 rpm and 8 rpm, as it is possible in this way to form very thin metal-containing layers which can partly also extend only over half a layer.

BRIEF DESCRIPTION OF THE DRAWINGS

For a better understanding of the invention the latter is explained in more detail with reference to the following Figures.

In a schematically simplified representation:

FIG. 1 shows a cross section of a schematic representation of a coating;

FIG. 2 shows an embodiment variant of a coating chamber;

DETAILED DESCRIPTION OF THE PREFERRED EMBODIMENTS

Figure 3:
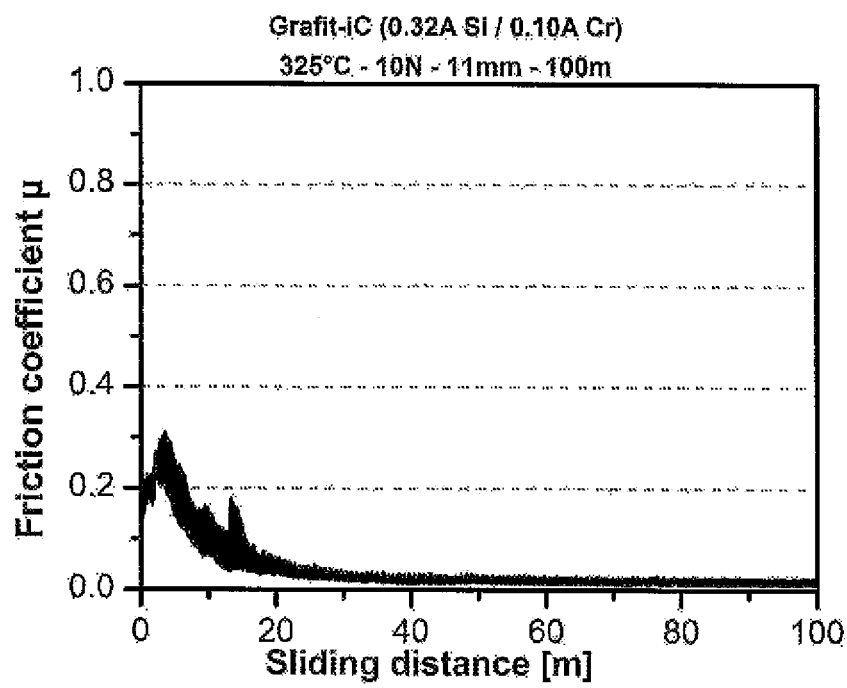
FIG. 3 shows the graphic representation of the path of the coefficient of friction of a first embodiment variant of the coating.

First of all, it should be noted that in the variously described exemplary embodiments the same parts have been given the same reference numerals and the same component names, whereby the disclosures contained throughout the entire description can be applied to the same parts with the same reference numerals and same component names. Also details relating to position used in the description, such as e.g. top, bottom, side etc. relate to the currently described and represented figure and in case of a change in position should be adjusted to the new position.

FIG. 1 shows a much simplified representation of a preferred embodiment variant of a layer structure 1 of a coating 2 on a substrate 3.

The substrate 3 is preferably a metal object or a metal workpiece, for example a bearing element, such as e.g. a plain bearing or roller bearing, a motor part, such as e.g. a cam follower, a cam shaft, a piston, an injection valve, a gearwheel, a part of a hydraulic system, such as e.g. a valve spool, a part of a mold, such as e.g. an injection mold. In particular the substrate 3 is a piston ring.

However, it is also possible to provide non-metallic substrates 3 with the coating 2, in that the latter are provided with a metal coating prior to depositing the coating according to the invention.

The coating 2 is applied directly onto the substrate 3 without an intermediate layer, although it is possible to arrange at least one of the metal adhesive layers known from the prior art between the coating 2 and the substrate 3.

As the lower layer or bonding layer a chromium nitride layer can be used for example underneath and directly adjoining the coating 2.

In particular, in the case of directly coating the substrate 3 but also with the arrangement of a lower layer or bonding layer, the coating preferably comprises a graduated gradation layer 4, which directly adjoins the substrate 3 or the possibly provided intermediate layer (adhesive layer). Said graduated gradation layer 4 is preferably also provided to improve the adhesion of the coating 2 to the substrate 3. If the adhesion of the coating 2 to the substrate 3 is sufficient without said gradation layer 4 for the respective application the gradation layer 4 can be omitted.

The graduated gradation layer 4 is preferably formed by the elements also provided in the remaining coating. Consequently, the gradation layer 4 comprises carbon (graphite), at least one first element selected from a group comprising the transition metals from groups 3 to 10 (new IUPAC nomenclature) of the periodic table of the elements, in particular from a group comprising or consisting of titanium, zirconium, hafnium, vanadium, niobium, tantalum, chromium, molybdenum, tungsten and compounds thereof, and at least one further element selected from a group comprising or consisting of silicon, germanium, aluminum and the transition metals from group 3 to 10 (new IUPAC nomenclature) of the periodic table of the elements, in particular titanium, zirconium, hafnium, vanadium, niobium, tantalum, chromium, molybdenum, tungsten and compounds thereof, with the proviso that the at least one further element is not the same as the first element or consists of these elements.

The carbon is mostly present in $sp^2$ hybridized form. The term "mostly" is used in the present the invention to mean that the proportion of $sp^2$ hybridized carbon is at least 50%, in particular at least 80%, preferably at least 90%, for example between 55% and 75%, relative to the total amount of carbon in the coating 2. The remainder to 100% is usually in $sp^3$ hybridized form. It is also possible in particular that the carbon is provided completely in $sp^2$ hybridized form.

The proportion of carbon increases in the gradation layer 4 from the surface of the substrate 3 or the possibly provided intermediate layer in the direction of the outer surface of the coating 2 (arrow 5). The proportion of the at least one first element decreases however in the same direction. The proportion of the at least one further element in the first gradation layer increases in the same direction. For example, the gradation layer 4 is made of carbon, chromium and silicon, wherein the proportion of carbon increases in the given direction, the proportion of chromiunm decreases and the proportion of silicon increases.

However, it is also possible for the gradation layer 4 to be made solely of carbon and the at least one first element is made for example of carbon and chromium, wherein the proportion of carbon increases in the indicated direction and proportion of the at least one first element decreases in this direction.

Furthermore, it is possible that a different first element and/or a different further element is used in the gradation layer 4 than in the remaining coating 2, although this is not the preferred embodiment variant in terms of process engineering, as in this case at least one addition target has to be used. For example, the gradation layer 4 can contain titanium in addition to carbon as the first element and/or the further element can comprise tungsten or the gradation layer 4 can be made from these elements, and in the remaining coating 2 over the gradation layer 4 chromium can be provided instead of titanium as the first element and/or silicon instead of tungsten.

Preferably, the proportion of carbon increases in the given direction (arrow 5) in the gradation layer 4 from 0 at % (atom percent), in particular 2 at %, to a value of between 90 at % and 100 at %, in particular between 94 at % and 96 at %, preferably 95 at %.

It is also preferable if the proportion of the at least one first element in the gradation layer 4 decreases in the direction of arrow 5 from 100 at %, in particular 98 at %, to a value of between 0 at % and 6 at %, in particular between 2 at % and 4.5 at %, preferably 3 at %.

Provided that at least one further element is also present in the gradation layer 4, it is preferable if the proportion of the at least one further element increases from 0 at % to a value of between 0.5 at % and 10 at %, in particular between 1.5 at % and 3.5 at %, preferably 2.5 at %.

With regard to the amount 100 at % it should be noted that this only applies of course if targets of these elements are used which have a suitably high degree of purity. If conventionally used purity levels of the elements are used amounts of 100 at % are unachievable because of impurities. This means that in this range none of the further elements of the coating 2 are present, unless as impurities.

Furthermore, it should be noted at this point that as already known argon can be included as the processing-related "impurity" in the coating or the gradation layer 4. The argon content can be up to 3.5 at %, in particular 2.5 at %. If argon is contained in the coating or the gradation layer 4 the amount of the respective component of the coating or the individual layers or the gradation layer 4 is reduced.

The layer thickness of the gradation layer 4 is between 0.1 µm and 5 µm, preferably between 0.1 µm and 0.5 µm.

If an adhesion layer is applied between the coating 2 and the substrate 3 as an intermediate layer, for example made of chromium or titanium, in particular chromium, its layer thickness is preferably between 0.05 µm and 1 µm, in particular between 0.1 µm and 0.2 µm.

A layer system of consecutive individual layers 6 to 9 adjoins the gradation layer 4. In the shown embodiment variant said layer system consists of a sequence of four individual layers 6 to 9 respectively, wherein for reasons of clarity only one individual layer 6 to 9 is shown. The number of individual layers 6 to 9 or the sequence of these individual layers 6 to 9 relates to the total layer thickness 10 of said layer system, which can be between 0.5 µm and 5 µm, in particular between 1.5 µm and 3.5 µm, preferably between 2.0 µm and 2.5 µm.

The system of individual layers 6 to 9 thus has a periodicity of four and consists of a sequence of the individual layer 6 comprising at least one first element, in particular a transition metal selected from a group comprising or consisting of the transition metals from groups 3 to 10 (new IUPAC nomenclature) of the periodic table of the elements, in particular from a group comprising or consisting of titanium, zirconium, hafnium, vanadium, niobium, tantalum, chromium, molybdenum, tungsten, the individual layer 7 of carbon with mostly $sp^2$ hybridization, which is deposited directly onto the individual layer 6, from the individual layer 8 of the at least one further elements selected from a group comprising or consisting of silicon, germanium, aluminum and the transition metals from groups 3 to 10 (new IUPAC nomenclature) of the periodic table of the elements, in particular titanium, zirconium, hafnium, vanadium, niobium, tantalum, chromium, molybdenum, tungsten, with the proviso that at least one further element is not the same as the first element, which is deposited directly on the individual layer 7, and the individual layer 9 made of carbon with mostly $sp^2$ hybridization is deposited directly onto the individual layer 8. Afterwards this sequence of individual layers 6 to 9 is repeated, as indicated in FIG. 1 by dots.

However, it is also possible to have a different sequence, for example the sequence carbon layer-carbon layer-layer from the first element-layer from the further element or the sequence layer from the first element-carbon layer-carbon layer-layer from the further element or the sequence layer from the further element-carbon layer-carbon layer-layer from the first element, etc. The sequence conforms with the relative arrangement of the targets to one another. It is thus possible for example to have a sequence of targets consisting of a carbon target or carbon-containing target, a further carbon target or carbon-containing target, a silicon target or silicon-containing target and a chromium target or chromium-containing target respectively in the direction of rotation of the object to be layered.

A preferred embodiment variant of the coating 2 comprises the layer system as individual layers 6 to 9: the individual layer 6 of chromium, the individual layer 7 of carbon with mostly $sp^2$ hybridization, the individual layer 8 of silicon and the individual layer 9 of carbon with mostly $sp^2$ hybridization.

The layer thicknesses of the metal individual layers 6 and 8 can vary between 0 nm and 0.2 nm, in particular between 0 nm and 0.1 nm. The value "zero" means that the metal individual layers 6 and 8 do not need to extend over the entire surface of the respective underlying layer, but also only part areas are layered, wherein, in any case at least 50%, in particular at least 80%, of the respective underlying layer are covered by the corresponding individual layer 6 or 8. The individual layers 6 and 8 can thus have an uneven layer thickness. The not completely covered surface coating is a result of the preferred method of production which is explained in more detail in the following, in particular the speed of rotation of the substrate. This incomplete coating does not have any or does not have any essential worsening effects on the desired properties of the coating 2. In the preferred embodiment variant however the individual layers 6 and 8 cover the full surface without any faults and have only one manufacturing difference from the middle layer thickness—relative to the whole individual layer 6 or 8. If necessary, existing faults are filled by the material of the respective adjacent individual layer 7, 9.

It is also possible that the two metal individual layers 6 and 8 have a different layer thickness from one another so that for example the layer thickness of the individual layer 8 is greater than the layer thickness of the individual layer 6, or vice versa.

The carbon-based individual layers 7 and 9 can have a layer thickness of between 0.5 nm and 1.5 nm, in particular between 0.6 nm and 0.9 nm. It is also possible here that the two individual layers 7 and 9 have a different layer thickness from one another. Preferably, the layer thickness of the individual layers 7 or 9 of carbon is greater than the layer thicknesses of the metal individual layers 6 or 8. However, it is also possible that all of the individual layers 6 to 9 within a period or within the whole layer system of the sequence of individual layers 6 to 9 have at least almost the same layer thickness.

In the sequence of layers of the coating 2 a metal individual layer 6 or 8, for example a layer of the at least one first element or layer of the at least one further element or a layer of carbon can adjoin the gradation layer 4.

An outermost further gradation layer 11 opposite the graduated gradation layer 4 in the path of the layer thickness of the coating is preferably formed by a layer of carbon, for example by an individual layer 7.

It is also possible that an additional functional layer is applied onto said further gradation layer 11, for example a so-called running-in layer, which can wear away at least partly during the operation of the object. For example such an additional functional layer can be formed by a lubricant layer e.g. based on a polyamide-imide lubricant, which if necessary contains solid lubricants such as e.g. $MoS_2$ and/or graphite. In general, said functional layer can have a lower hardness level and/or greater toughness than the individual layers of the underlying coating or at least of the individual layer adjoining the functional layer directly. Preferably, the functional layer does not comprise carbides. The functional layer can also contain at least one metal, wherein the amount of metal in the functional layer can be greater than in the immediately underlying individual layer of the coating 2. Likewise however, pure carbon layers are possible as functional layers, in particular a carbon layer as described in EP 1 036 208 B1.

The layer system comprising the individual layers 6 to 9 can comprise a cumulative fraction of the at least one further element of between 0.1 at % and 5 at %, in particular between 0.5 at % and 4 at %, preferably between 1 at % and 2.3 at %. The cumulative fraction of the at least one first element can be between 0.05 at % and 10 at %, in particular between 0.1 at % and 8 at %, preferably between 0.1 at % and 1 at %. The remainder is formed by carbon and possibly processing-related impurities.

In addition to the embodiment variant of the layer system consisting of individual layers 6 to 9 or the coating 2 with individual layers 6 to 9 of pure elements it is also possible that at least some of the individual layers 6 to 9 consist of a multi-element system of at least two individual elements selected from the aforementioned chemical elements described for the first or the second element. Mixed targets are used for this purpose for the deposition.

It is also possible within the scope of the invention that the layer system is designed not only as a sequence of four individual layers 6 to 9, but there can be fewer or additional individual layers, for example three, five, six, seven or eight individual layers 6 to 9.

Preferably, the coating 2 is hydrogen-free and/or does not include any carbides, in particular no carbides with the at least one further element.

The term "hydrogen-free" is commonly used in the terminology relating to this field to mean that a proportion of hydrogen is possible of a maximum of 10 wt. %, in particular 3 wt. % to a maximum of 5 wt. %, although the complete absence of hydrogen is also possible.

With regard to the inclusion of carbides it should be noted that the absence of carbides does not necessarily relate to the two outermost gradation layers of the coating 2 but the preferred absence of carbide relates to the individual layers of the coating 2 between the two outermost gradation layers, although the two outermost gradation layers or at least one of these two gradation layers can also be configured to be free of carbide.

The coating 2 is produced by means of a PVD method. Preferably, in principle the closed field sputtering method known from EP 1 036 208 B1 is used, particular reference is made to the general method which forms part of the present description in this connection. A possible and preferred embodiment variant of a coating chamber 12 is shown in FIG. 2.

The coating chamber 12 comprises 4 targets 13 to 16, which are distributed in particular uniformly around the circumference of the coating chamber 12, as shown in FIG. 2. The two targets 13 and 15 are made of the carbon (graphite), the target 14 of the at least one further element, in particular silicon, and the target 16 of the at least one first element, in particular chromium. The substrate 3 to be coated is arranged on a substrate holder 17, in particular a rotary disc. By rotating the substrate holder 17 or by moving the substrate holder 17 the substrate 3 enters into the area of influence of the target 13 to 16, i.e. its vapor beams from the respective vaporized target material, as usual in sputtering method, which is deposited on the substrate 2 in layers. In this way the aforementioned layered structure of the layer system or the coating 2 is achieved.

Of course, it is possible that to increase the efficiency of the coating system more than one substrate 3 is arranged on the substrate holder 17. It is also possible to design the substrate holder 17 to have a different shape other than a rotary disc.

As such coating systems form part of the prior art reference is made to the relevant prior art to avoid repetition with regard to the structure and the individual components of the system.

It is also possible, as already explained above, that the sequence of the targets is different from the arrangement thus described, i.e. for example two carbon targets are arranged immediately next to one another and then a target of the further element, in particular silicon, or the first element, in particular chromium, and then a target of the first element, in particular chromium, or the further element, in particular silicon, wherein the two metal targets are made from different elements or comprise the latter.

The substrate 3 can have a temperature during the coating of between 80° C. and 250° C., in particular between 150° C. and 220° C., if necessary it can also be cooled.

To produce the coating 2 the substrate 3, possibly after usual pre-cleaning, in particular degreasing, is fed or inserted into the coating chamber 17. This is followed if necessary by a single or repeated evacuation and "rinsing" of the coating chamber 17, in order to adjust the necessary edge conditions for the coating, in particular the desired atmosphere, in the coating chamber 17.

In a first step the substrate 3 can then be subjected to a so-called sputter cleaning in order to prepare its surface for the deposition of the coating 2. In this case a bias voltage is applied to the substrate of between −200 V and −1000 V, preferably −400 V. The sputter cleaning is performed preferably with a pulsed voltage with a frequency selected from a range between 50 kHz and 500 kHz, in particular 250 kHz. Said cleaning can be performed over a time span of between 5 minutes and 60 minutes, in particular 20 minutes.

Further parameters of the sputter cleaning:
Atmosphere: argon
Pressure: $5 \times 10^{-4}$ to $1 \times 10^{-1}$ mbar
Temperature: maximum 220° C.

Afterwards, if necessary an adhesive layer can be deposited onto the surface of the substrate. In principle, metals can use used for this that are selected from the aforementioned group of elements for the first element or alloys thereof. Preferably however a metal is used which is also used in the coating 2, in particular chromium or titanium, preferably chromium. For the deposition a voltage is applied to the substrate 2 which is selected from a range with a lower limit of 0 V and an upper limit of 150 V. In particular, the voltage is 50 V. In the preferred embodiment variant in this step a pulsed voltage is used with a frequency selected from a range between 50 kHz and 500 kHz, in particular 250 kHz. The time of the deposition corresponds to the desired layer thickness according to the above explanations.

Additional parameters:
Atmosphere: argon
Pressure: $5 \times 10^{-4}$ to $1 \times 10^{-2}$ mbar, in particular $8 \times 10^{-4}$ to $5.1 \times 10^{-3}$ mbar
Temperature: 20° C. to 220° C.

In the third or second method step (if no adhesive layer is applied) the actual coating 2 is applied. For this first of all, the graduated gradation layer 4 can be produced from the respective elements.

Parameters of deposition:
Voltage to the substrate 3: between 30 V and 90 V, in particular between 50 V and 70 V, direct voltage, if necessary pulsed direct voltage (frequency 50 kHz to 500 kHz).
Atmosphere: argon, nitrogen (if optionally a chromium nitride layers is deposited as an underlayer below the coating 2)
Pressure: $5 \times 10^{-4}$ to $1 \times 10^{-2}$ mbar, in particular $8 \times 10^{-4}$ to $5.1 \times 10^{-3}$ mbar
Temperature: 80° C. to 250° C.

Lastly, the actual functional layer is deposited, i.e. the layer system of the sequence of individual layers 6 to 9.

Parameters of deposition:
Voltage to the substrate 3: between 30 V and 90 V, in particular between 50 V to 70 V, direct voltage, if necessary pulsed direct voltage (frequency 50 kHz to 500 kHz).
Atmosphere: argon
Pressure: $7 \times 10^{-4}$ to $6 \times 10^{-3}$ mbar,
Temperature: 80° C. to 250° C.
Rotational speed of the substrate 3: between 2 rpm and 8 rpm, in particular 5 rpm Voltage to the targets: 200 V to 1000 V In general, the voltage to the substrate 3 is selected such that a cumulative fraction is obtained of this at least one further element in the coating of between 0.1 at % and 5 at % and a cumulative fraction of the at least one first element of between 0.5 at % and 10 at %, or from the preferred ranges described above.

Instead of four targets 13 to 16 more targets can also be used, for example five or six or seven or eight. Likewise only three targets can be used. These additional targets are preferably made of carbon. For example—as viewed in the direction of rotation of the substrate 3—three carbon targets can be arranged one after the other, a chromium target, three carbon targets and a silicon target.

According to this generally described method the following samples were produced according to Table 1. As the substrates 3 M42 HSS-steel was used with a sample diameter of 25 mm and a thickness or 3 mm and a 1.2379 steel with a sample diameter of 40 mm and a thickness of 8 mm. Said substrates 3 were mounted at a distance of about 160 mm-170 mm from the targets 13 to 16. In general, this distance can be selected from a range with a lower limit of 40 mm and an upper limit of 250 mm, in particular from a range with a lower limit of 80 mm and an upper limit of 200 mm. The coating is performed by single rotation at a rotational speed of 5 rpm. The processing pressure in the coating chamber 17 during the coating was $9 \times 10^{-4}$ Torr. As targets 13 to 16 a silicon target, a chromium target and two carbon targets were used in an arrangement C—Cr—C—Si. This results in an approximate layer thickness sequence of 4 "layers" (calculated from the total layer thickness and the depositing parameters) C—0.5 "layers" Cr—4 "layers" C—0.5 "layers" Si per revolution.

The current strengths used at the Si and Cr targets are given in Table 1. The current strength per C-target was between 3.5 A and 5 A.

TABLE 1

Compositions of test samples according to RBS analysis

| No. | I on Cr-target [A] | I on Si-target [A] | Cr [at %] | Si [at %] | C |
|---|---|---|---|---|---|
| 1 | 0.27 | 0 | 3.9 | 0 | remainder |
| 2 | 0.2 | 0.16 | 0.1 | <0.1 | remainder |
| 3 | 0.2 | 0.23 | 0.15 | 0.98 | remainder |
| 4 | 0.2 | 0.23 | 0.16 | 1.0 | remainder |
| 5 | 0.15 | 0.32 | 0.1 | 1.8 | remainder |
| 6 | 0.10 | 0.32 | 0.5 | 1.8 | remainder |
| 7 | 0.1 | 0.32 | 0.5 | 3.4 | remainder |
| 8 | 0.1 | 0.45 | 0.5 | 3.4 | remainder |
| 9 | 0.32 | 0 | 4.1 | 0 | remainder |

The analysis of the samples was performed by means of ion scattering using an AN700 accelerator. For the analysis helium ions and protons were used with particle energies of 600 keV. To evaluate the experimental spectra the computer simulation program SIMNRA was used, which was developed at the Max Planck Institute for Plasma Physics.

Furthermore, X-ray spectra of the particle-induced radiation were recorded. This enables clear identification of the elements available in the sample independently of the RBS spectra.

It should be noted at this point that the examples 1 to 9 according to Table 1 are selected test samples of the preferred quantities of the individual elements. Test samples were also prepared with the aforementioned amount ranges for the first element of in total between 0.5 at % and 10 at % and for the further element of in total between 0.1 at % (atomic percent) and 5 at %. Furthermore, test samples were prepared with other elements than silicon and chromium, the metal elements being selected from the aforementioned groups. The complete data on all test samples would exceed the scope of this description so that Table 2 only shows preferred test samples.

Tribological tests and wear groove tests were performed on these samples. The tribological tests were performed by a CSM tribometer with the so-called "ball-on-disc" configuration:

Ball: $Al_2O_3$, 6 mm diameter
Weight: 10 N
Temperature: room temperature, 250° C., 325° C.
Sliding distance: 1000 m at room temperature, 100 m at 250° C. and 325° C.
Speed: 10 m/s
Radius: 7 mm at room temperature, 9 mm at 250° C., 11 mm at 325° C.

Furthermore, analyses (2D and 3D) were performed using a Veeco white light profilometer.

The results of the wear tests are summarized in Table 2.

TABLE 2

Wear rates (SWR) at 40N, coefficients of Motion at 40N (dry - tested as described in EP 1 036 208 B1), hardness values and adhesive strengths (assessed and classified according to VDI-Guideline 3198)

| No. | SWR | μ | hardness [kg/mm²] | thickness [μm] | Rc (middle, edge) |
|---|---|---|---|---|---|
| 1 | $1.0 \times 10^{-17}$ | 0.063 | 1345 | 2.2 | 1.1 |
| 2 | $3.0 \times 10^{-17}$ | 0.058 | 1484 | 2.4 | 1.2 |
| 3 | $5.4 \times 10^{-17}$ | 0.056 | 1465 | 2.2 | 1.2 |
| 4 | $3.8 \times 10^{-17}$ | 0.063 | 1715 | 2.2 | 1.2 |
| 5 | $1.3 \times 10^{-17}$ | 0.075 | 2123 | 2.3 | 4.1 |
| 6 | $1.8 \times 10^{-16}$ (20N) | 0.090 (20N) | 2225 | 2.1 | 1.1 |
| 7 | $3.3 \times 10^{-17}$ | 0.120 | 1792 | 2.1 | 3.3 |
| 8 | $1.8 \times 10^{-16}$ | 0.150 | 1895 | 2.2 | 3.3 |
| 9 | $3.06 \times 10^{-17}$ | 0.033 (80N) | 1444 | 2.5 | 1.1 |

Figure 4:
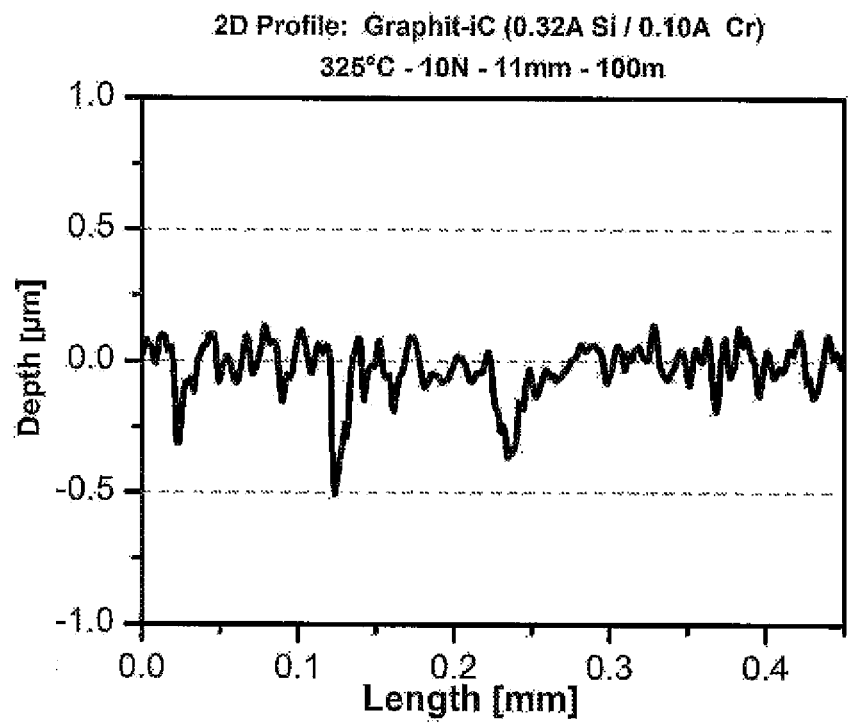
FIG. 4 shows a 2D representation of the surface roughness of coating of the first embodiment variant.
Figure 5:
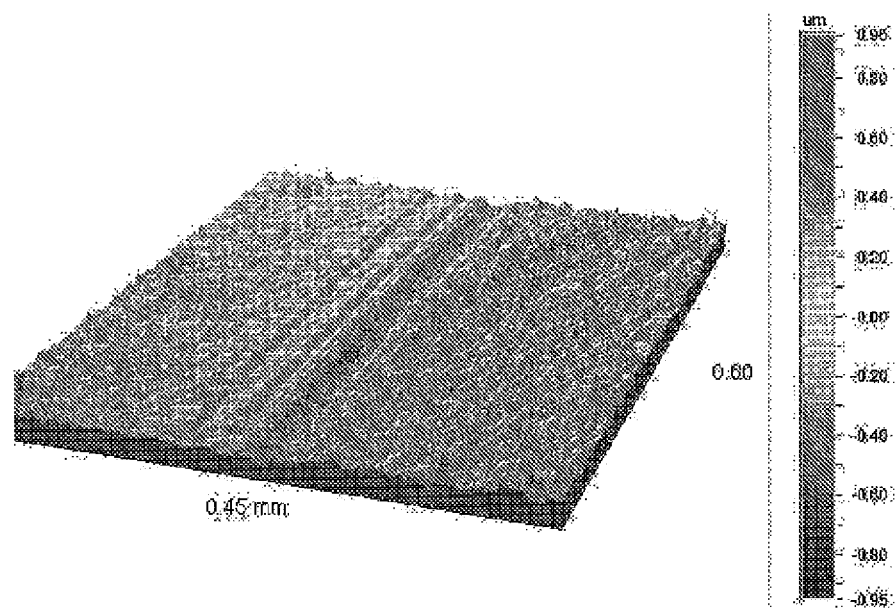
FIG. 5 shows a 3D representation of the surface of the coating of the first embodiment variant after a completed wear test.
Figure 6:
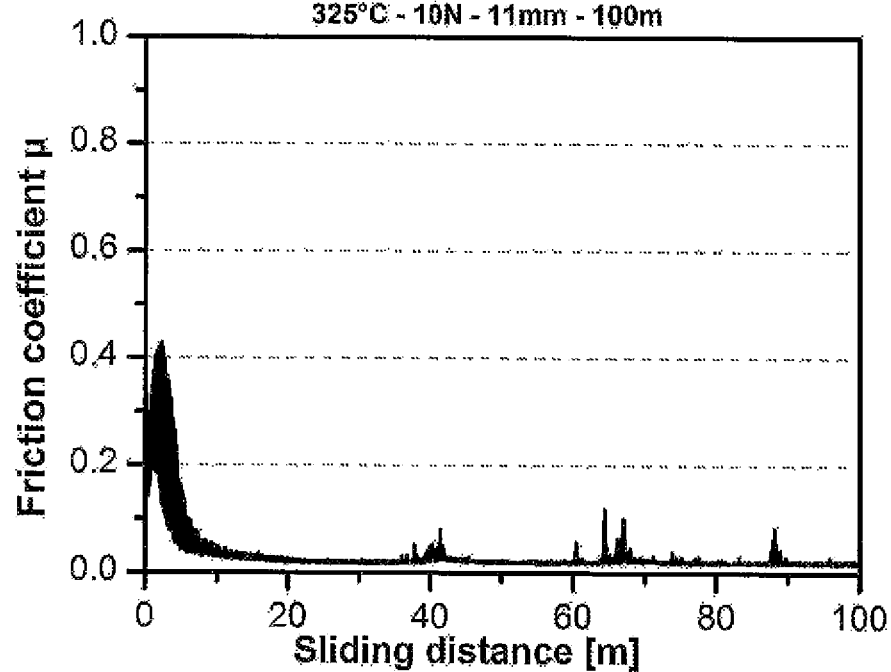
FIG. 6 shows the graphic representation of the path of the coefficient of friction of a second embodiment variant of the coating.
Figure 7:
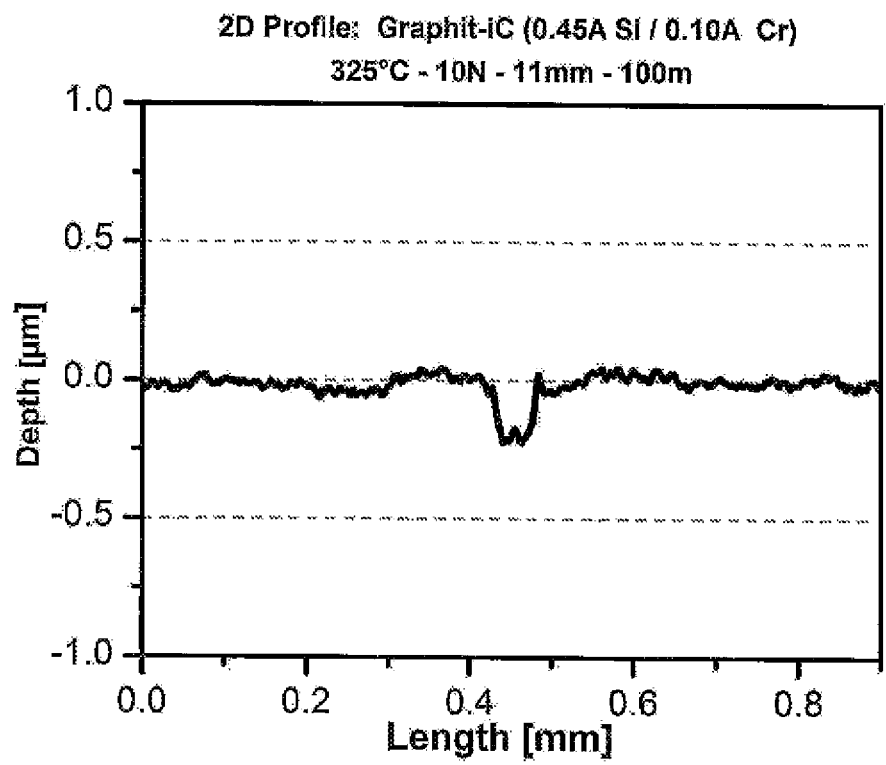
FIG. 7 shows a 2D representation of the surface roughness of the coating of the second embodiment variant.
Figure 8:
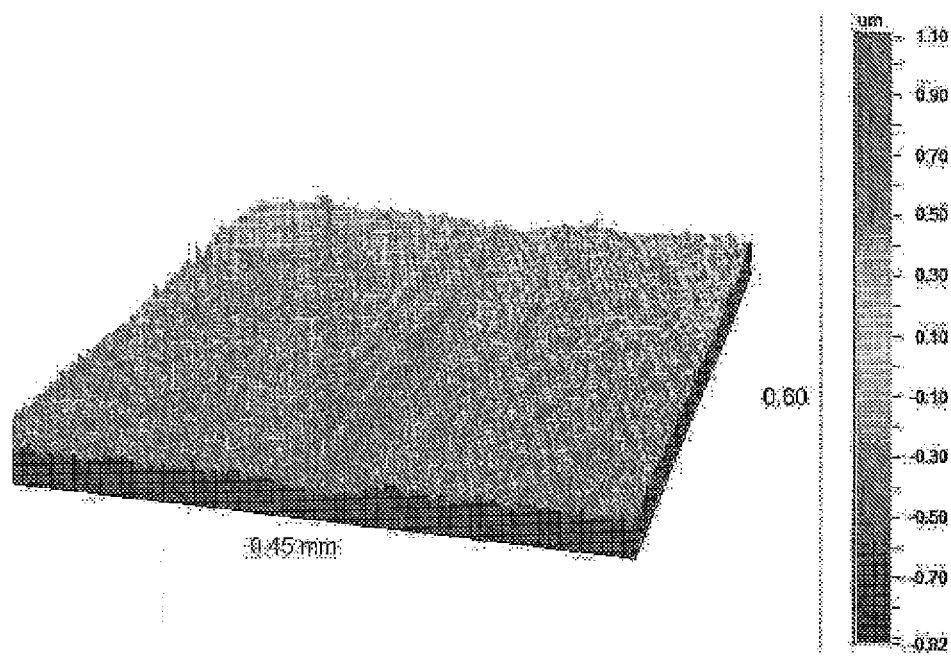
FIG. 8 shows a 3D representation of the surface of the coating of the second embodiment variant after the completed wear test.
Figure 9:
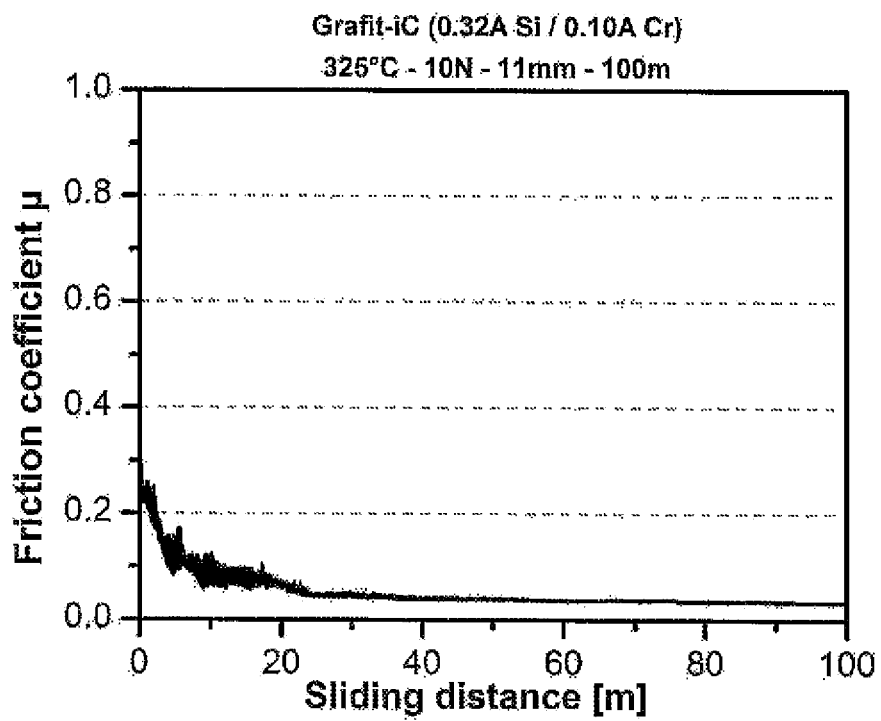
FIG. 9 shows the graphic representation of the path of the coefficient of friction of a third embodiment variant of the coating.
Figure 10:
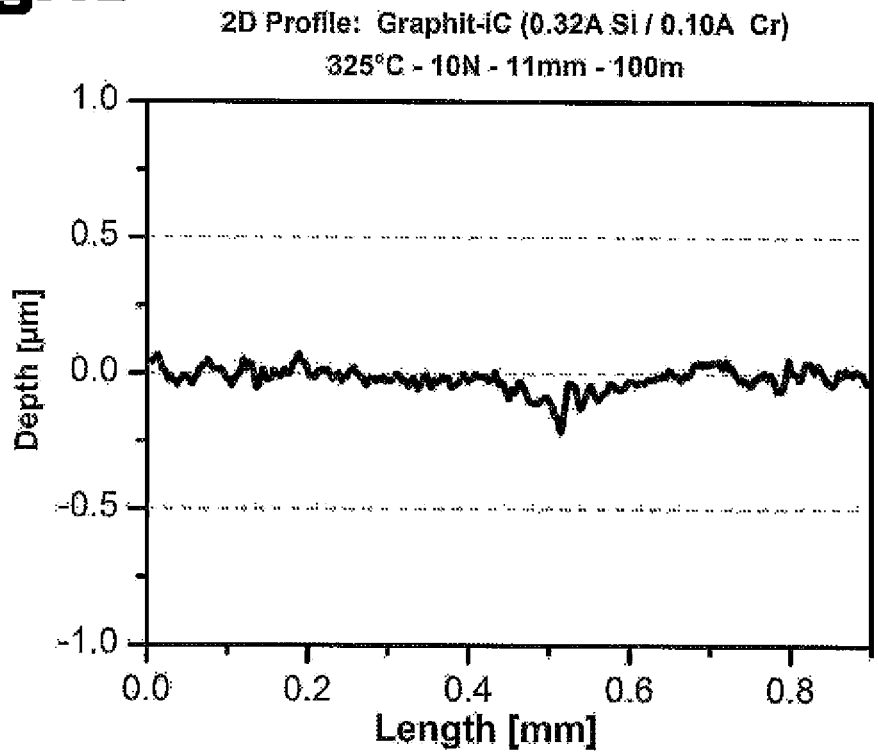
FIG. 10 shows a 2D representation of the surface roughness of the coating of the third embodiment variant.
Figure 11:
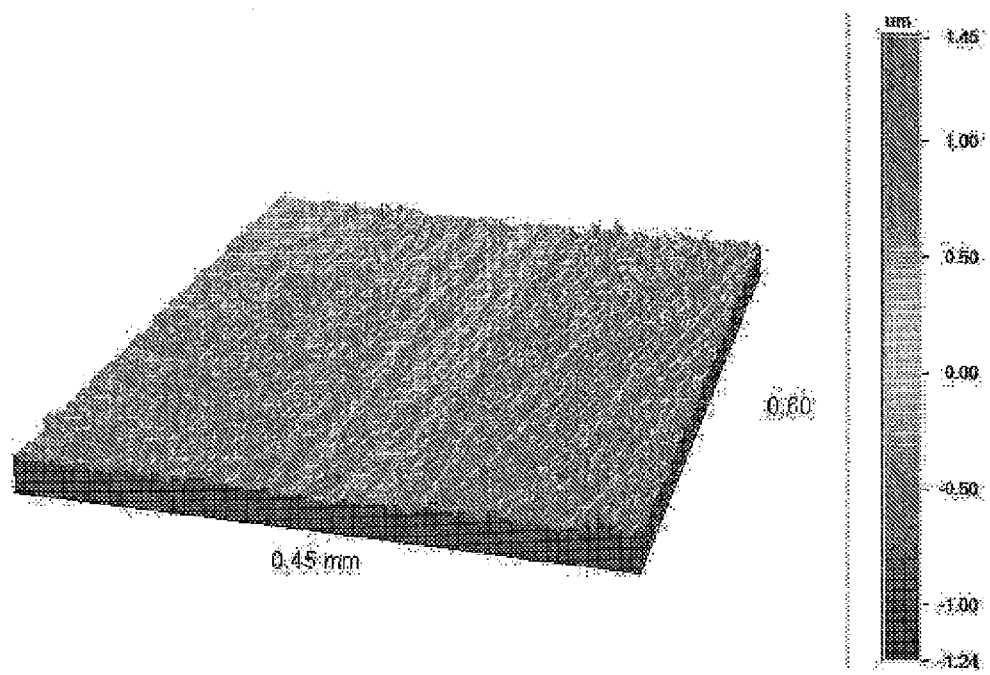
FIG. 11 shows a 3D representation of the surface of the coating of the third embodiment variant after the completed wear test.
Figure 12:
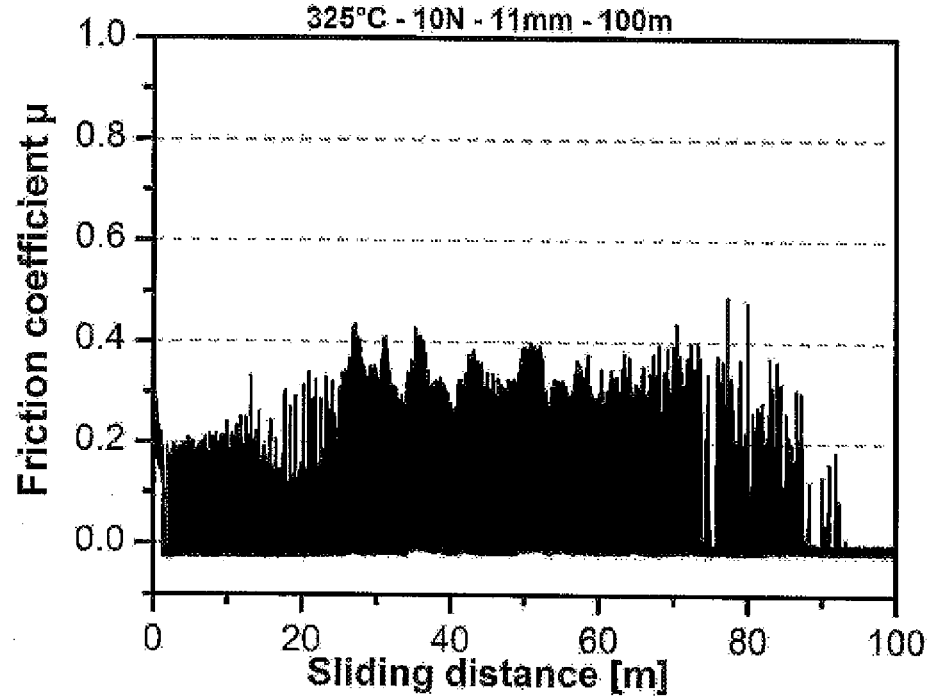
FIG. 12 shows the graphic representation of the path of the coefficient of friction of a comparison sample of the coating.
Figure 13:
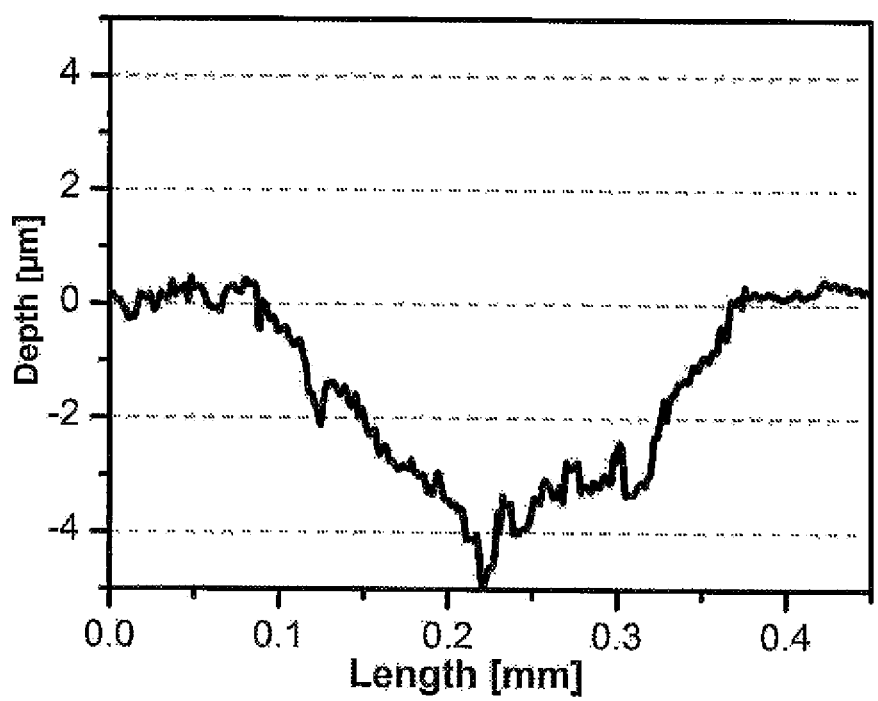
FIG. 13 shows a 2D representation of the surface roughness of the coating of the comparison sample.
Figure 14:
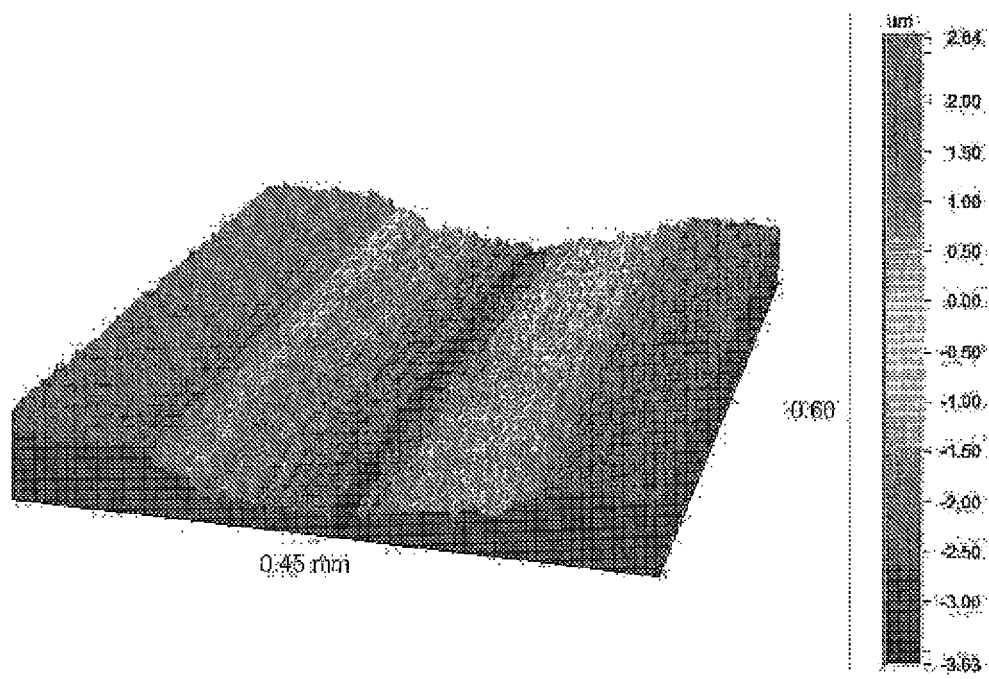
FIG. 14 shows a 3D representation of the surface of the coating of the comparison sample after completing the wear test.
Figure 15:
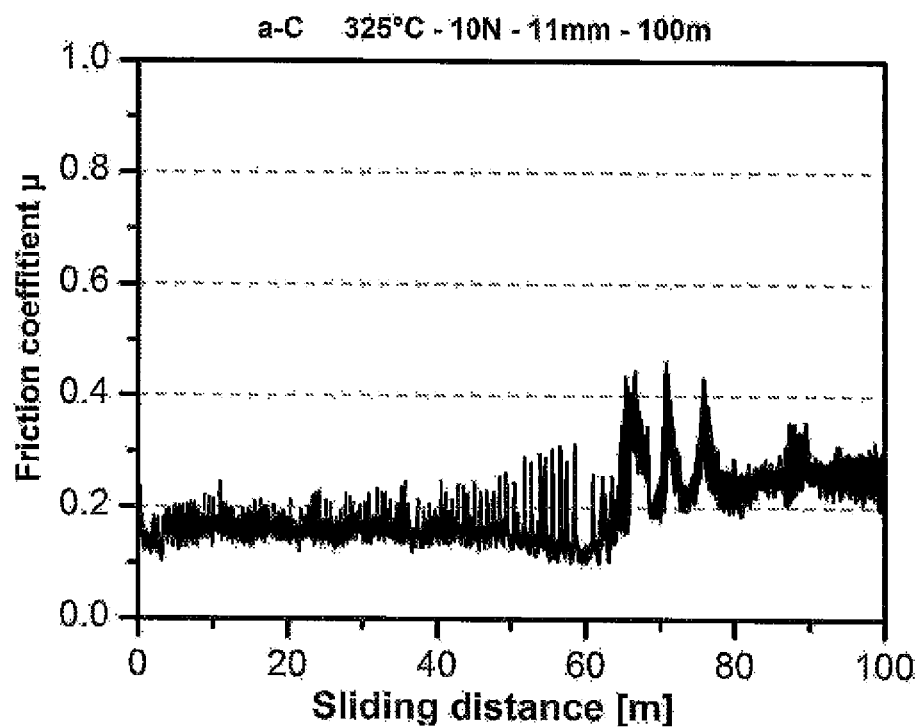
FIG. 15 shows the graphic representation of the path of the coefficient of friction of an embodiment variant of the coating according to the prior art.
Figure 16:
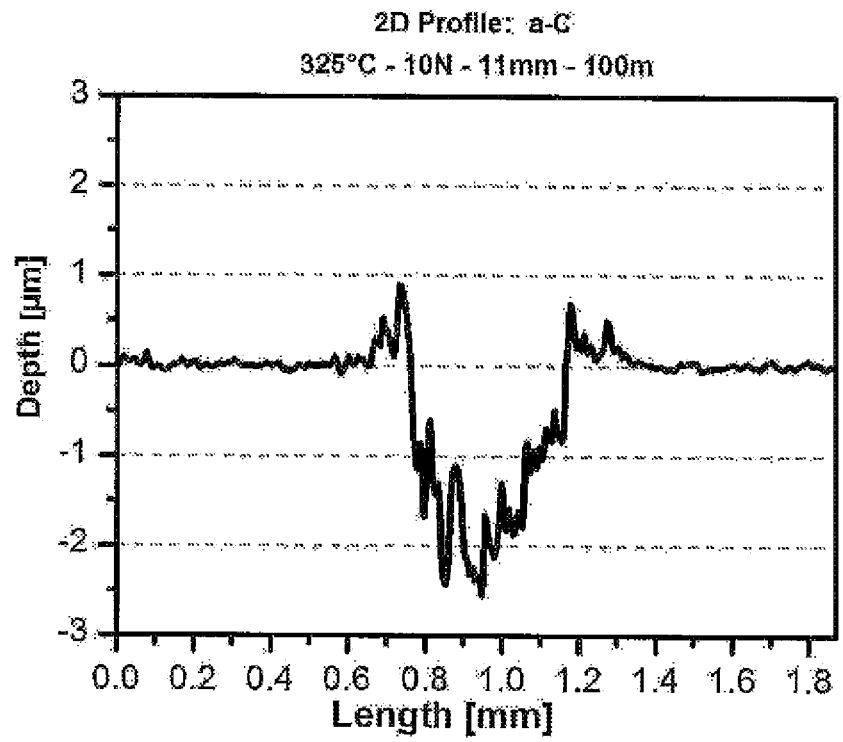
FIG. 16 shows a 2D representation of the surface roughness of the coating according to the prior art.
Figure 17:
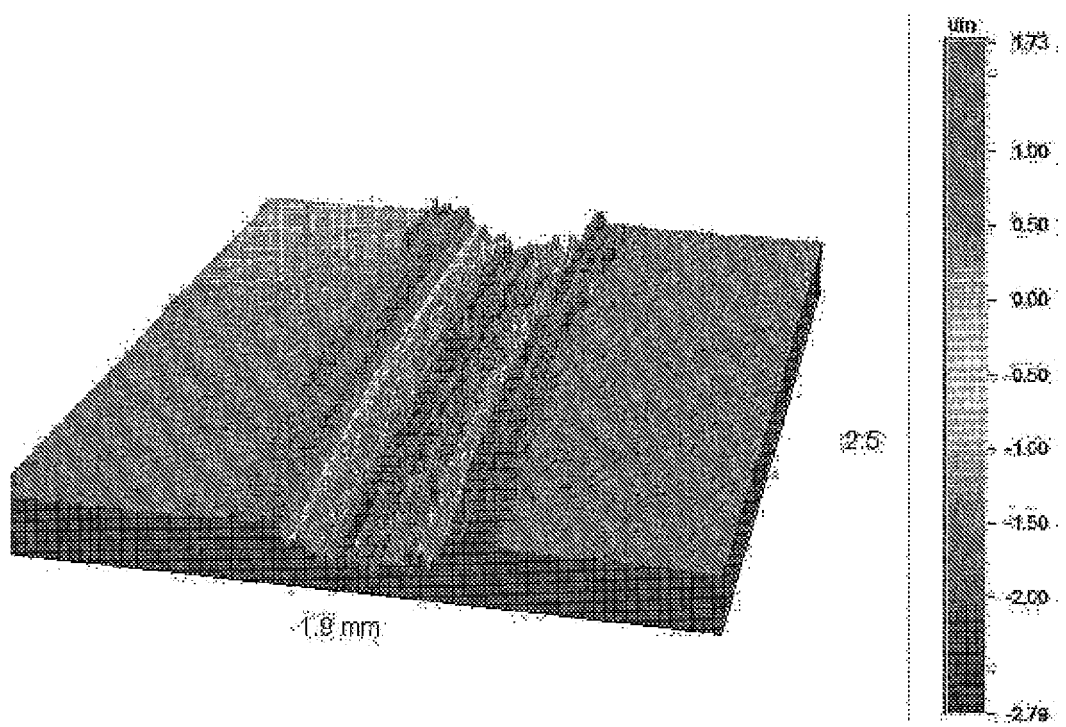
FIG. 17 shows a 3D representation of the surface of the coating according to the prior art after completing the wear test.

The graphic representations of the coefficient of friction and the 2D and 3D surface analyses are describes in FIGS. 3 to 5 for sample 6, FIGS. 6 to 8 for sample 8, FIGS. 9 to 11 for sample 7, FIGS. 12 to 14 for sample 3 and FIGS. 15 to 17 for sample 1, measured respectively at 325° C.

All of these tests showed that coatings 2 with 0.5 at % to 1 at % Cr, 1 at % to 2 at % Si and remainder C ($sp^2$) provided the best results. In general, coatings 2 with 0.1 at % to 5 at % Cr, 1.0 at % to 10 at % Si and remainder C ($sr^2$) also provided very good results. However the sample 1, which corresponds to a composition according to EP 1 036 208 B1 without Si, showed clear evidence of wear at higher temperatures (measurement temperature 325° C.), as shown in particular in FIGS. 16 and 17. Sample 2 also showed at this temperature clear traces of wear (FIGS. 13 and 14). It is therefore preferable if the ratio of Cr/Si—or generally the ratio of the at least one transition metal/to the at least one further element in the coating 2 is between 0.5/5 and 1/5.

Lastly, it is also noted that the carbon is quasi-amorphous with a crystalline fraction of a maximum of 10%.

The exemplary embodiments show possible embodiment variants of the coating 2 or its method of production, whereby it should be noted at this point that the invention is not restricted to the embodiment variants shown in particular, but rather various different combinations of the individual embodiment variants are also possible and this variability, due to the teaching on technical procedure, lies within the ability of a person skilled in the art in this technical field.

Finally, as a point of formality, it should be noted that for a better understanding of the structure of the coating 2 the latter and its components have not been represented true to scale in part and/or have been enlarged and/or reduced in size.

LIST OF REFERENCE NUMERALS

1 layer structure
2 coating
3 substrate
4 gradation layer
5 arrow
6 individual layer
7 individual layer
8 individual layer
9 individual layer
10 total layer thickness
11 gradation layer
12 coating chamber
13 target
14 target
15 target
16 target
17 substrate holder

The invention claimed is:

1. A multi-layer coating having carbon as the main component, wherein the carbon in the coating is mostly present in $sp^2$-hybridized form, the coating comprising:
   at least one first element selected from a first group consisting of the transition metals from groups 3 to 10 (new IUPAC nomenclature) of the periodic table of the elements, and
   at least one further element from a further group consisting of silicon, germanium, aluminum and the transition metals from groups 3 to 10 (new IUPAC nomenclature) of the periodic table of the elements,
   with the proviso that the at least one further element is not the same as the first element,
   wherein the cumulative fraction of this at least one further element in the coating is between 0.1 at % and 5 at % and the cumulative fraction of the at least one first element is between 0.5 at % and 10 at %,
   wherein the coating is formed by a layer system comprising individual layers of different compositions directly deposited on one another,
   wherein:
   (a) the layer system is formed by a sequence of individual layers comprising
      a first sub-layer with the first element as the main component,
      a second sub-layer with carbon as the main component,
      a third sub-layer with the further element as the main component and
      a fourth sub-layer with carbon as the main component,
      wherein
      (i) the first sub-layer, the second sub-layer, the third sub-layer, and the fourth sub-layer consist of pure elements; or
      (ii) the first sub-layer, the second sub-layer, the third sub-layer, and the fourth sub-layer comprise a multi-element system of at least two individual elements selected from the first group or the further group, wherein the layer thickness of each of the sub-layers where either the first element or the further element predominates is between 0 nm and 0.2 nm and the layer thickness of each of the sub-layers where carbon is the main component is between 0.5 nm and 1.5 nm; or
   (b) the layer system is formed by the sequence of individual layers comprising
      a first sub-layer with carbon as the main component,
      a second sub-layer with carbon as the main component,
      a third sub-layer with the first element as the main component and
      a fourth sub-layer with the further element as the main component.

2. The coating as claimed in claim 1,
   wherein the first sub-layer, the second sub-layer, the third sub-layer, and the fourth sub-layer consist of pure elements, or the layer system is formed by the sequence of individual layers comprising a first sub-layer with carbon as the main component, a second sub-layer with carbon as the main component, a third sub-layer with the first element as the main component and a fourth sub-layer with the further element as the main component; and
   wherein the layer thicknesses of the sub-layers where carbon is the main component are greater than the layer thicknesses of the sub-layers where either the first element or the further element predominates.

3. An assembly comprising
   a substrate;
   a first gradation layer directly deposited on the substrate; and
   a multi-layer coating having carbon as the main component directly deposited on the first gradation layer;
   wherein the carbon in the coating is mostly present in $sp^2$-hybridized form, the coating comprising:
   at least one first element selected from a first group consisting of the transition metals from groups 3 to 10 (new IUPAC nomenclature) of the periodic table of the elements, and
   at least one further element from a further group consisting of silicon, germanium, aluminum and the transition metals from groups 3 to 10 (new IUPAC nomenclature) of the periodic table of the elements,
   with the proviso that the at least one further element is not the same as the first element,
   wherein the cumulative fraction of this at least one further element in the coating is between 0.1 at % and 5 at % and the cumulative fraction of the at least one first element is between 0.5 at % and 10 at %,
   wherein the coating is formed by a layer system comprising individual layers of different compositions directly deposited on one another,
   wherein:
   (a) the layer system is formed by a sequence of individual layers comprising
      a first sub-layer with the first element as the main component,
      a second sub-layer with carbon as the main component,
      a third sub-layer with the further element as the main component and
      a fourth sub-layer with carbon as the main component, wherein
(i) the first sub-layer, the second sub-layer, the third sub-layer, and the fourth sub-layer consist of pure elements; or
(ii) the first sub-layer, the second sub-layer, the third sub-layer, and the fourth sub-layer comprise a multi-element system of at least two individual elements selected from the first group or the further group, wherein the layer thickness of each of the sub-layers where either the first element or the further element predominates is between 0 nm and 0.2 nm and the layer thickness of each of the sub-layers where carbon is the main component is between 0.5 nm and 1.5 nm;
(b) the layer system is formed by the sequence of individual layers comprising
a first sub-layer with carbon as the main component,
a second sub-layer with carbon as the main component,
a third sub-layer with the first element as the main component and
a fourth sub-layer with the further element as the main component, wherein the first gradation layer has
a first major surface configured to be co-extensive with a major surface of a the substrate and
a second major surface co-extensive with a bottom-most sub-layer of the layer system,
wherein the first gradation layer is formed by a graduated transitional layer, in which the proportion of carbon increases in the direction of the overlaying bottom-most sub-layer and the proportion of the first element decreases in this direction.

4. The coating as claimed in claim 3, wherein the proportion of the at least one further element increases in the first gradation layer in the direction of the overlaying bottom-most sub-layer.

5. The coating as claimed in claim 3, wherein the proportion of carbon in the first gradation layer increases from 0 at % to a value of between 90 at % and 100 at %.

6. The coating as claimed in claim 3, wherein the proportion of the at least one first element in the first gradation layer decreases from 100 at % to a value of between 0 at % and 6 at %.

7. The coating as claimed in claim 3, wherein the proportion of the at least one further element in the first gradation layer increases from 0 at % to a value of between 0.5 at % and 10 at %.

8. An object having deposited thereon the multi-layer coating according to claim 1.

9. A method for producing a multi-layer coating having carbon as the main component on a substrate by sputtering, wherein the carbon in the coating is mostly present in $sp^2$-hybridized form, the coating comprising:
at least one first element selected from a first group consisting of the transition metals from groups 3 to 10 (new IUPAC nomenclature) of the periodic table of the elements, and
at least one further element from a further group consisting of silicon, germanium, aluminum and the transition metals from groups 3 to 10 (new IUPAC nomenclature) of the periodic table of the elements,
with the proviso that the at least one further element is not the same as the first element, and wherein the voltage at the substrate is selected so that a cumulative fraction of this at least one further element in the coating is between 0.1 at % and 5 at % and a cumulative fraction of the at least one first element is between 0.5 at % and 10 at %,
wherein the coating is formed by a layer system comprising individual layers of different compositions directly deposited on one another,
wherein:
(a) the layer system is formed by a sequence of individual layers comprising
a first sub-layer with the first element as the main component,
a second sub-layer with carbon as the main component,
a third sub-layer with the further element as the main component and
a fourth sub-layer with carbon as the main component,
wherein
(i) the first sub-layer, the second sub-layer, the third sub-layer, and the fourth sub-layer consist of pure elements; or
(ii) the first sub-layer, the second sub-layer, the third sub-layer, and the fourth sub-layer comprise a multi-element system of at least two individual elements selected from the first group or the further group, wherein the layer thickness of each of the sub-layers where either the first element or the further element predominates is between 0 nm and 0.2 nm and the layer thickness of each of the sub-layers where carbon is the main component is between 0.5 nm and 1.5 nm; or
(b) the layer system is formed by the sequence of individual layers comprising
a first sub-layer with carbon as the main component,
a second sub-layer with carbon as the main component,
a third sub-layer with the first element as the main component and
a fourth sub-layer with the further element as the main component.

10. The method as claimed in claim 9, wherein for the deposition of the coating a sequence of targets is used, wherein a target comprising the at least one further element is arranged between two carbon targets.

11. The method as claimed in claim 9, wherein for the deposition of the coating, a sequence of targets is used, wherein a target comprising the at least one first element is arranged between two carbon targets.

12. The method as claimed in claim 9, wherein the substrate is rotated during the coating at a rotational speed of between 2 rpm and 8 rpm.

13. The coating as claimed in claim 1, wherein the first sub-layer, the second sub-layer, the third sub-layer, and the fourth sub-layer do not contain carbides.

14. The coating as claimed in claim 1, wherein the first sub-layer, the second sub-layer, the third sub-layer, and the fourth sub-layer contain hydrogen in a proportion of a maximum of 10 wt. %.

* * * * *